(12) United States Patent
Sugiyama et al.

(10) Patent No.: US 7,038,250 B2
(45) Date of Patent: May 2, 2006

(54) SEMICONDUCTOR DEVICE SUITED FOR A HIGH FREQUENCY AMPLIFIER

(75) Inventors: Toru Sugiyama, Tokyo (JP); Tetsuro Nozu, Tokyo (JP); Kouhei Morizuka, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 10 days.

(21) Appl. No.: 10/834,347

(22) Filed: Apr. 29, 2004

(65) Prior Publication Data

US 2005/0001233 A1    Jan. 6, 2005

(30) Foreign Application Priority Data

May 28, 2003    (JP)    ............... 2003-151380

(51) Int. Cl.
*H01L 29/732* (2006.01)
*H01L 31/0328* (2006.01)
*H01L 31/0336* (2006.01)
*H01L 31/072* (2006.01)
*H01L 31/109* (2006.01)

(52) U.S. Cl. ............... 257/183; 257/189; 257/191; 257/196; 257/197; 257/198; 257/200; 257/201; 257/615

(58) Field of Classification Search ......... 257/189.191, 257/196–198, 200–201, 615, 183
See application file for complete search history.

(56) References Cited

U.S. PATENT DOCUMENTS

| | | | |
|---|---|---|---|
| 4,679,305 A * | 7/1987 | Morizuka | 438/318 |
| 4,933,732 A * | 6/1990 | Katoh et al. | 257/197 |
| 5,010,382 A * | 4/1991 | Katoh | 257/15 |
| 5,138,408 A * | 8/1992 | Ando | 257/134 |
| 5,150,185 A * | 9/1992 | Yamada | 257/197 |
| 5,336,909 A * | 8/1994 | Katoh et al. | 257/197 |
| 6,127,716 A * | 10/2000 | Morizuka et al. | 257/503 |
| 6,727,153 B1 * | 4/2004 | Chow | 438/312 |

(Continued)

FOREIGN PATENT DOCUMENTS

JP    2002-359249    12/2002

OTHER PUBLICATIONS

T. Tanaka, et al., Journal of Crystal Growth, vol. 221, pp. 515-519, "Ordering-Induced Electron Accumulation at GaInP/GaAs Hetero-Interfaces", 2000.

(Continued)

*Primary Examiner*—Ida M. Soward
(74) *Attorney, Agent, or Firm*—Oblon, Spivak, McClelland, Maier & Neustadt P.C.

(57) ABSTRACT

According to the present invention, there is a provided a semiconductor device having, a collector contact layer made of an n-type GaAs layer; a first collector layer formed on the collector contact layer and made of an n-type GaAs layer; a second collector layer formed on the first collector layer and made of a p-type GaAs layer; a third collector layer formed on the second collector layer and made of an n-type InGaP layer; a fourth collector layer formed on the third collector layer and made of an n-type InGaP layer having an impurity concentration higher than that of the third collector layer; a fifth collector layer formed on the fourth collector layer and made of an n-type GaAs layer; a base layer formed on the fifth collector layer and made of a p-type GaAs layer; and an emitter layer formed on the base layer and made of an n-type InGaP layer.

10 Claims, 13 Drawing Sheets

U.S. PATENT DOCUMENTS

| | | | |
|---|---|---|---|
| 6,756,615 B1 | 6/2004 | Yoshioka et al. | 257/198 |
| 6,806,513 B1* | 10/2004 | Chau et al. | 257/198 |
| 6,881,988 B1* | 4/2005 | Niwa et al. | 257/197 |
| 2003/0213973 A1* | 11/2003 | Yoshioka et al. | 257/183 |
| 2004/0178475 A1* | 9/2004 | Harmon et al. | 257/567 |
| 2004/0238843 A1* | 12/2004 | Sawadai et al. | 257/197 |

OTHER PUBLICATIONS

J.-I. Song, et al., Electronic Letters, vol. 29, No. 21, pp. 1881-1883, "Characterisation of GaInP/GaAs Double Heterojunction Bipolar Transistors With Different Collector Designs", Oct. 14, 1993.

* cited by examiner

U.S. 7,038,250 B2

SEMICONDUCTOR DEVICE SUITED FOR A HIGH FREQUENCY AMPLIFIER

CROSS REFERENCE TO RELATED APPLICATION

This application is based upon and claims benefit of priority under 35 USC §119 from the Japanese Patent Application No. 2003-151380, filed on May 28, 2003, the entire contents of which are incorporated herein by reference.

BACKGROUND OF THE INVENTION

The present invention relates to a semiconductor device and, more particularly, to a semiconductor device suited for a high-frequency amplifier.

A power amplifier module using an InGaP/GaAs heterojunction bipolar transistor is widely used in the fields of cell phones and the like.

The reliability of a device can be improved by using an InGaP layer as an emitter material instead of an AlGaAs layer.

The efficiency of a power amplifier is an important characteristic which extends a continuous conversation time. One effective method of increasing the efficiency of a power amplifier is to reduce an offset voltage Vce offset. To reduce the offset voltage Vce offset, it is possible to use a double heterojunction bipolar transistor using a wide-gap material in a collector layer as well as in an emitter layer.

If a thick InGaP layer is used as a collector layer, however, the mobility of electrons in this InGaP layer becomes lower than that in a GaAs layer. Therefore, if the collector layer is entirely replaced with an InGaP layer, the high-frequency characteristics significantly deteriorate.

Accordingly, to reduce the offset voltage Vce offset, as shown in FIG. 13, it is effective to form a thin InGaP layer 3 only in a portion of a collector layer in contact with a GaAs base layer 2, and form the rest of the collector layer by a GaAs layer 4.

In this structure, however, if the InGaP layer 3 is ordered, "+" interface electric charge is produced in the interface between the InGaP collector layer 3 and GaAs collector layer 4. FIG. 14 shows a bandgap diagram in this case. This interface electric charge deteriorates the distortion characteristics of the amplifier. This will be explained in detail below.

FIG. 15 shows the output characteristics, i.e., the dependence of a collector current IC on an emitter-to-collector voltage VCE of a single heterojunction bipolar transistor (SHBT) using a wide-gap material only in an emitter layer, and a double heterojunction bipolar transistor (DHBT) using a wide-gap material in an emitter and collector as shown in FIG. 13.

Referring to FIG. 15, a curve L1 indicates the characteristic of the SHBT when a base current IB is 0.2 mA, a curve L2 indicates the characteristic of the DHBT when the base current IB is 0.2 mA, a curve L3 indicates the characteristic of the SHBT when the base current IB is 0.1 mA, and a curve L4 indicates the characteristic of the DHBT when the base current IB is 0.1 mA.

FIG. 15 shows that the offset voltage Vce offset of the DHBT is lower than that of the SHBT. Therefore, an increase in efficiency of an amplifier using this DHBT can be expected. In reality, however, the efficiency cannot be increased because the distortion characteristics of the amplifier deteriorate for the reasons explained below.

FIG. 16 shows changes in base-to-collector capacitance Cbc with respect to a collector-to-base voltage VCB. Referring to FIG. 16, a curve L11 indicates a capacitance when a forward bias is applied in the base-to-collector path of the DHBT, and a curve L12 indicates a capacitance when a forward bias is applied in the base-to-collector path of the SHBT.

As shown in FIG. 16, the increase in capacitance when a forward bias is applied in the base-to-collector path in the DHBT is larger than that in the SHBT.

Referring to FIG. 17, a line L21 indicates a change in maximum available gain with respect to a collector-to-base voltage VCB in the SHBT, and a line L22 indicates a change in maximum available gain with respect to the collector-to-base voltage VCB in the DHBT. The increase in capacitance when a forward bias is applied in the base-to-collector path makes the decrease in maximum available gain when a forward bias is applied in the base-to-collector path in the DHBT larger than that in the SHBT. As a consequence, the distortion characteristics of the amplifier deteriorate.

If an unordered InGaP layer is used as the collector layer, the generation of the interface electric charge as described above can be suppressed. However, band discontinuity in the conduction band in the junction portion between the p-type GaAs base layer 2 and n-type InGaP collector layer 3 blocks electrons injected from the base layer 2 into the collector layer 3. FIG. 18 shows a band diagram in this case. As shown in FIG. 18, at a point P11, a barrier is formed by band discontinuity in the conduction band in the junction portion between the p-type GaAs base layer 2 and n-type InGaP collector layer 3, and this barrier blocks the flow of electrons.

References disclosing the conventional semiconductor devices for high-frequency amplifiers are as follows.
Patent reference 1: Japanese Patent Laid-Open No. 2001-345328
Patent reference 2: Japanese Patent Laid-Open No. 2001-176881
Patent reference 3: Japanese Patent Laid-Open No. 2002-134524
Patent reference 4: U.S. Pat. No. 5,952,672
Patent reference 5: U.S. Pat. No. 6,465,816.

As described above, the conventional semiconductor devices have the problem that when the offset voltage Vce offset is decreased in order to increase the efficiency, the distortion characteristics deteriorate by the influence of interface electric charge generated between an ordered InGaP layer and a GaAs layer in a collector layer.

SUMMARY OF THE INVENTION

According to one aspect of the present invention, there is provided a semiconductor device comprising:
a collector contact layer made of an n-type GaAs layer;
a first collector layer formed on said collector contact layer and made of an n-type GaAs layer;
a second collector layer formed on said first collector layer and made of a p-type GaAs layer;
a third collector layer formed on said second collector layer and made of an n-type InGaP layer;
a fourth collector layer formed on said third collector layer and made of an n-type InGaP layer having an impurity concentration higher than that of said third collector layer;
a fifth collector layer formed on said fourth collector layer and made of an n-type GaAs layer;
a base layer formed on said fifth collector layer and made of a p-type GaAs layer; and an emitter layer formed on said base layer and made of an n-type InGaP layer.

According to one aspect of the present invention, there is provided a semiconductor device comprising:

a collector contact layer made of an n-type GaAs layer;

a first collector layer formed on said collector contact layer and made of an n-type GaAs layer;

a second collector layer formed on said first collector layer and made of an n-type InGaP layer;

a third collector layer formed on said second collector layer and made of an n-type InGaP layer having an impurity concentration higher than that of said second collector layer;

a fourth collector layer formed on said third collector layer and made of an n-type GaAs layer;

a base layer formed on said fourth collector layer and made of a p-type GaAs layer; and an emitter layer formed on said base layer and made of an n-type InGaP layer.

According to one aspect of the present invention, there is provided a semiconductor device comprising:

a collector contact layer made of an n-type GaAs layer;

a first collector layer formed on said collector contact layer and made of an n-type GaAs layer;

a second collector layer formed on said first collector layer and made of an n-type $Al_xGa_{(1-x)}As$ (x; 0→y) grading layer;

a third collector layer formed on said second collector layer and made of an n-type $Al_yGa_{(1-y)}As$ layer;

a fourth collector layer formed on said third collector layer and made of an n-type $Al_zGa_{(1-z)}As$ (z; y→0) grading layer;

a base layer formed on said fourth collector layer and made of a p-type GaAs layer; and an emitter layer formed on said base layer and made of an n-type InGaP layer.

According to one aspect of the present invention, there is provided a semiconductor device comprising:

a collector contact layer made of an n-type GaAs layer;

a first collector layer formed on said collector contact layer and made of an n-type GaAs layer;

a second collector layer formed on said first collector layer and made of an n-type $Al_yGa_{(1-y)}As$ layer;

a third collector layer formed on said second collector layer and made of an n-type $Al_xGa_{(1-w)}As$ (x; y→0) grading layer;

a base layer formed on said third collector layer and made of a p-type GaAs layer; and an emitter layer formed on said base layer and made of an n-type InGaP layer.

According to one aspect of the present invention, there is provided a semiconductor device comprising a collector layer, a base layer formed on said collector layer, and an emitter layer formed on said base layer, wherein a material used in said emitter layer has a band gap larger than that of a material used in said base layer, and said collector layer comprises:

a first n-type semiconductor layer formed by a material having a band gap larger than that of the material used in said base layer;

a p-type semiconductor layer formed in contact with said first n-type semiconductor layer; and a second n-type semiconductor layer formed in contact with said p-type semiconductor layer by using a material having a band gap smaller than that of said first n-type semiconductor layer.

DETAILED DESCRIPTION OF THE EMBODIMENTS

Embodiments of the present invention will be described below with reference to the accompanying drawings.

(1) First Embodiment

Figure 1:
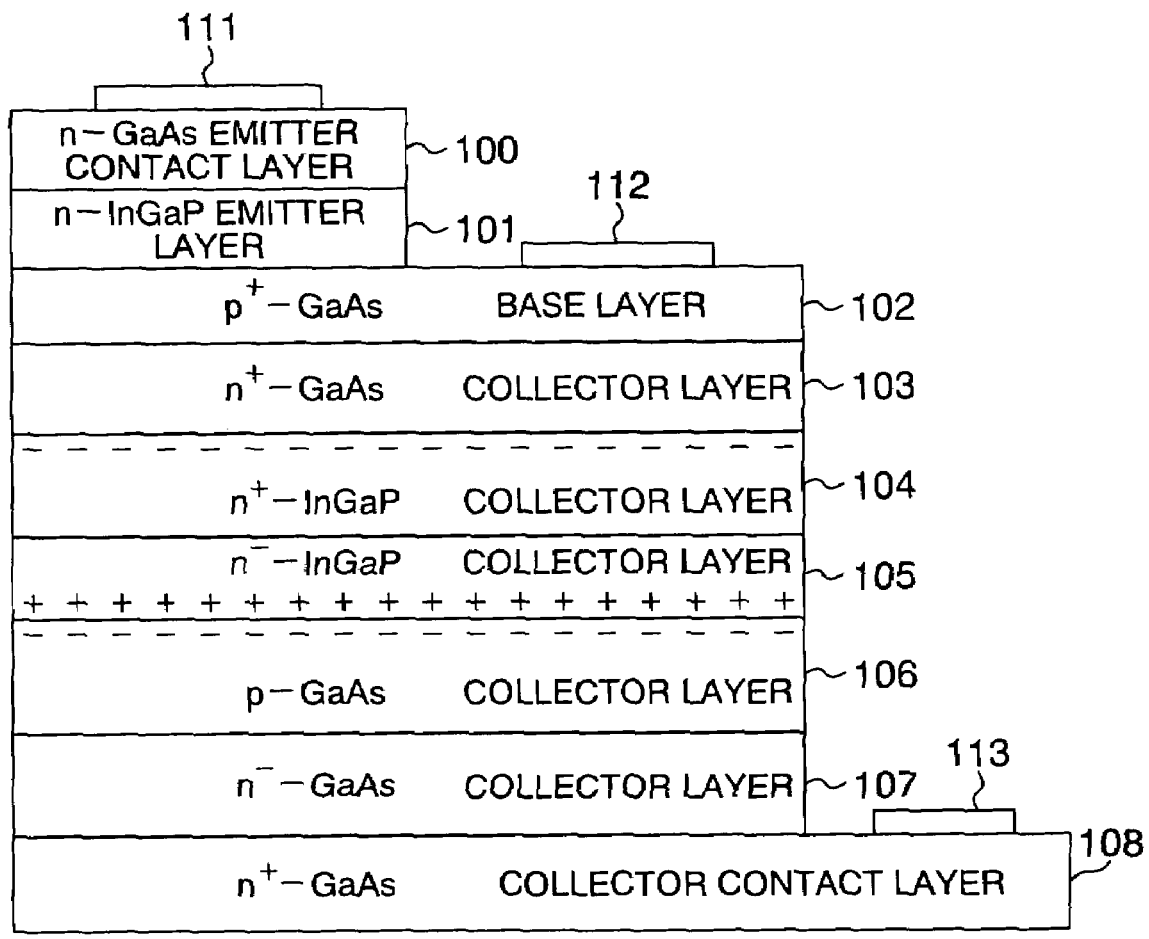
FIG. 1 is a longitudinal sectional view showing the arrangement of a semiconductor device according to the first embodiment of the present invention.

A semiconductor device according to the first embodiment of the present invention will be described below with reference to FIG. 1.

An n-type electrode 113 is formed on the surface of a portion of an $n^+$-type GaAs collector contact layer 108 having a doping concentration of $5\times10^{18}$ $cm^{-3}$ and a thickness of 500 nm. On the rest of the surface, an $n^-$-type GaAs collector layer 107 having a doping concentration of $1\times10^{16}$ $cm^{-3}$ and a thickness of 500 nm, a p-type GaAs collector layer 106 having a doping concentration of $5\times10^{18}$ $cm^{-3}$ and a thickness of 5 nm, an n⁻-type InGaP collector layer 105 having a doping concentration of $5 \times 10^{16}$ cm$^{-3}$ and a thickness of 10 nm, and a heavily doped n⁺-type InGaP collector layer 104 and heavily doped n⁺-type GaAs collector layer 103 for suppressing the effect (to be described later) of blocking electrons injected from a base layer into a collector layer are formed in this order.

In addition, a p⁺-type GaAs base layer 102 having a doping concentration of $4 \times 10^{19}$ cm$^{-3}$ and a thickness of 50 nm is formed, a p-type electrode 112 is formed on the surface of a portion of the p⁺-type GaAs base layer 102, and a an n-type InGaP emitter layer 101 having a doping concentration of $4 \times 10^{17}$ cm$^{-3}$ and a thickness of 20 nm is formed on the rest of the surface. On top of the n-type InGaP emitter layer 101, an n-type GaAs emitter contact layer 100 having a doping concentration of $5 \times 10^{18}$ cm$^{-3}$ and a thickness of 100 nm is formed. An n-type electrode 111 is formed on the surface of the n-type GaAs emitter contact layer 100.

As described above, the InGaP layer 101 is formed as a wide-gap emitter layer, the heavily doped p⁺-type GaAs layer 102 is formed as a base layer, and the heavily doped n⁺-type GaAs layer 103 is formed as a collector layer in contact with the base layer.

Below the heavily doped n⁺-type GaAs layer 103, the heavily doped n⁺-type InGaP layer 104, lightly doped n⁻-type InGaP layer 105, and p-type GaAs layer 106 are formed. The p-type GaAs layer 106 has an impurity concentration sufficient to compensate for positive interface charge generated in the interface between the InGaP layer 105 and GaAs layer 107, and a thickness of, e.g., about 5 nm which does not interfere with the transition of electrons. Below the p-type GaAs layer 106, the lightly doped n⁻-type GaAs layer 107 and the heavily doped n⁺-type GaAs collector contact layer 108 as a collector contact layer are formed.

The band gap of the InGaP layers used in the formation of the emitter layer 101 and collector layers 104 and 105 is larger than that of the GaAs layer used in the formation of the base layer 102.

The collector layer has a stacked structure including the collector layers 104 and 105 formed by the n-type InGaP layers having a band gap larger than that of the GaAs base layer 102, the p-type collector layer 106 in contact with the collector layer 105, and the n-type GaAs collector layer 107 in contact with the collector layer 106 and formed by the GaAs layer having a band gap smaller than that of the collector layers 104 and 105.

A double heterojunction bipolar transistor is formed using a wafer material having this stacked structure, and a power amplifier is manufactured by using this double heterojunction bipolar transistor.

Figure 13:
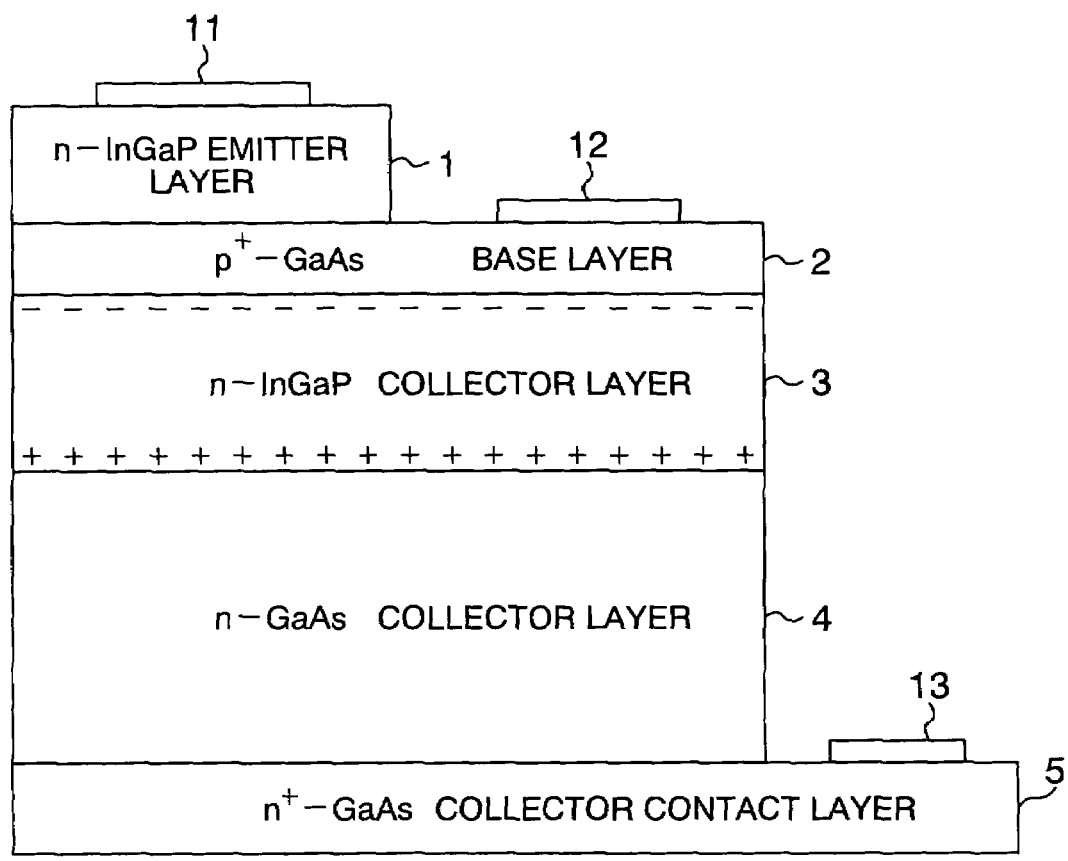
FIG. 13 is a longitudinal sectional view showing the arrangement of the conventional semiconductor device.
Figure 14:
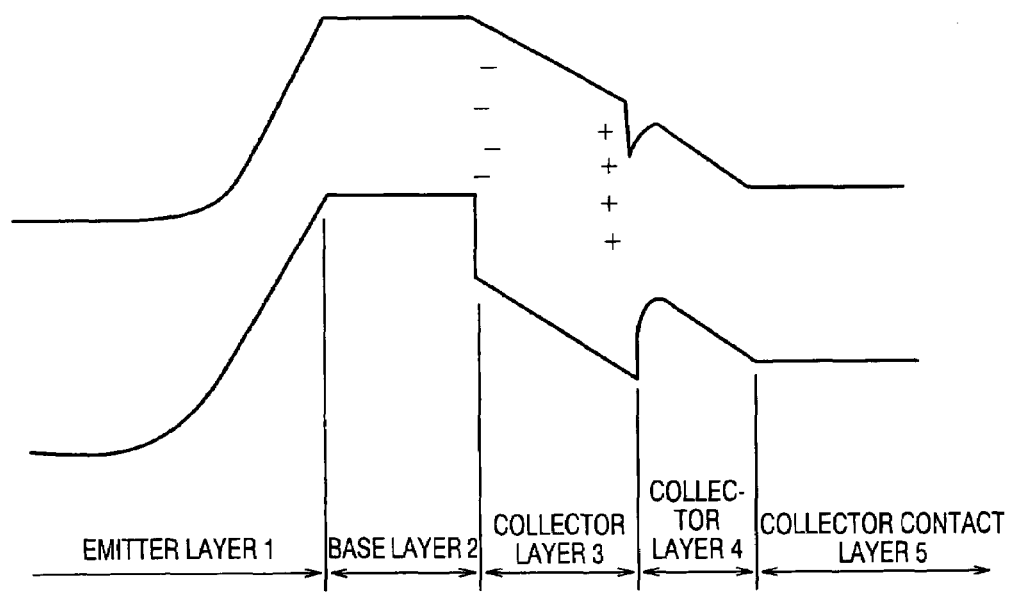
FIG. 14 is a band diagram in the semiconductor device shown in FIG. 13.
Figure 15:
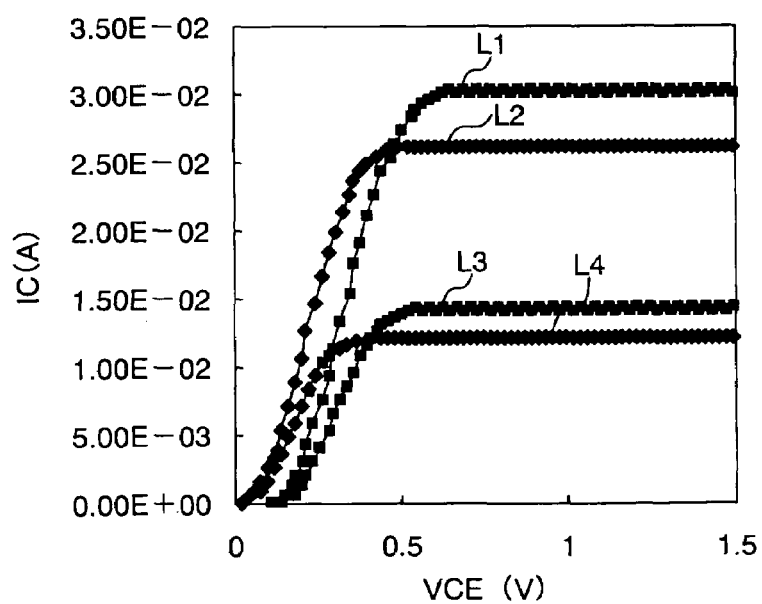
FIG. 15 is a graph showing the dependence of a collector current on a collector-to-emitter voltage in the conventional SHBT and DHBT.
Figure 16:
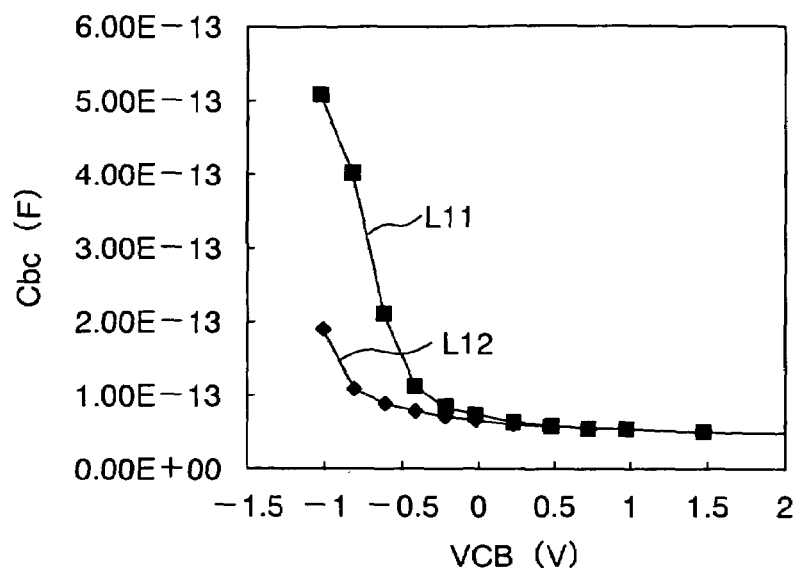
FIG. 16 is a graph showing changes in base-to-collector capacitance when a forward bias is applied in the collector-to-base path in the conventional SHBT and DHBT.
Figure 17:
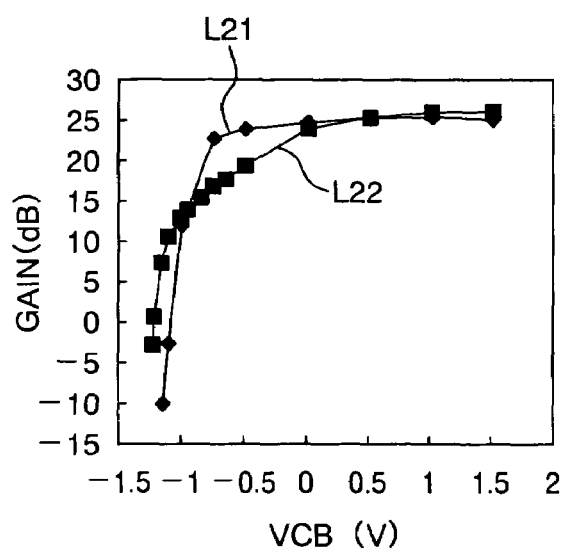
FIG. 17 is a graph showing changes in gain when a forward bias is applied in the collector-to-base path in the conventional SHBT and DHBT.
Figure 18:
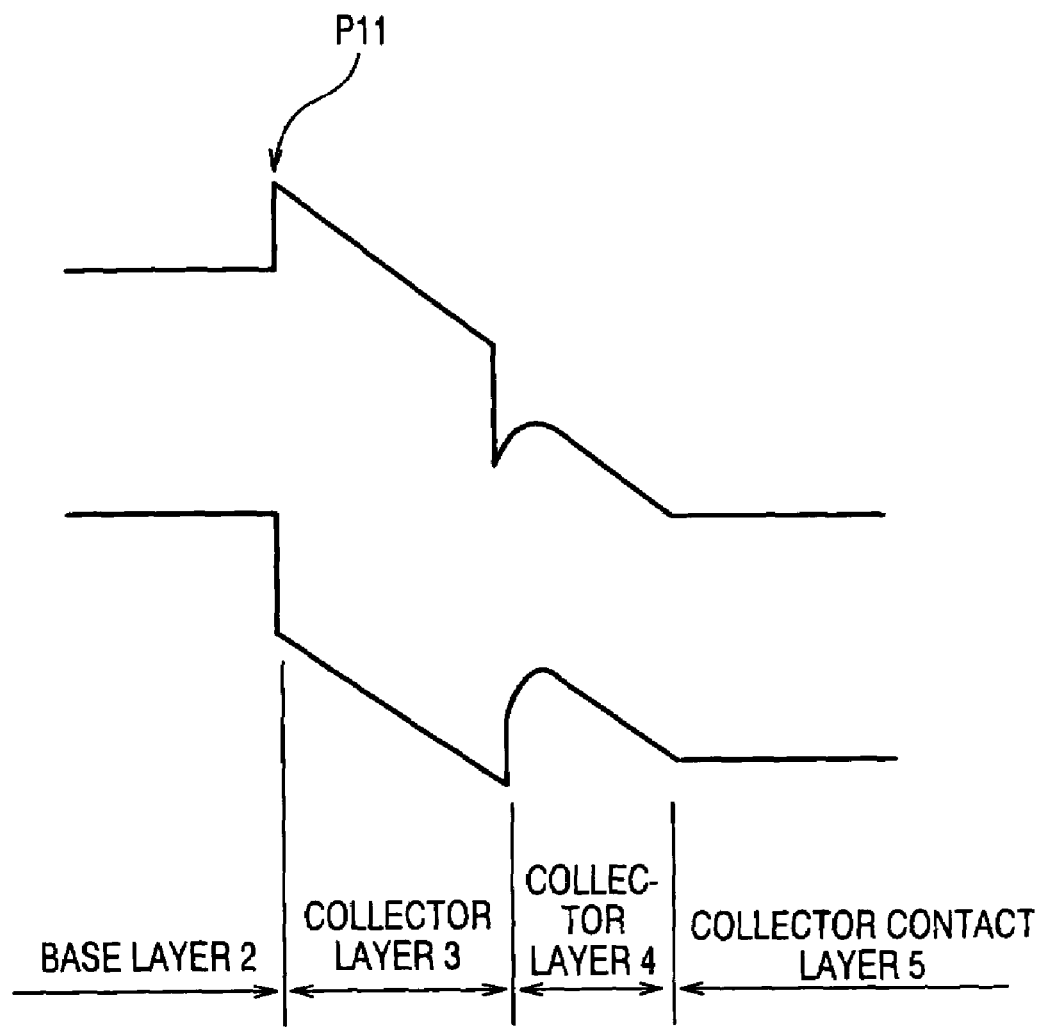
FIG. 18 is a band diagram in the conventional semiconductor device using an unordered InGaP layer as a collector layer.

In the conventional device shown in FIG. 13, as is also shown in the band diagram of FIG. 14, "+" interface electric charge is generated in the interface between the ordered n-type InGaP collector layer 3 and the n-type GaAs collector layer 4, and this increases the capacitance when a forward bias is applied in the collector-to-base path.

Figure 2:
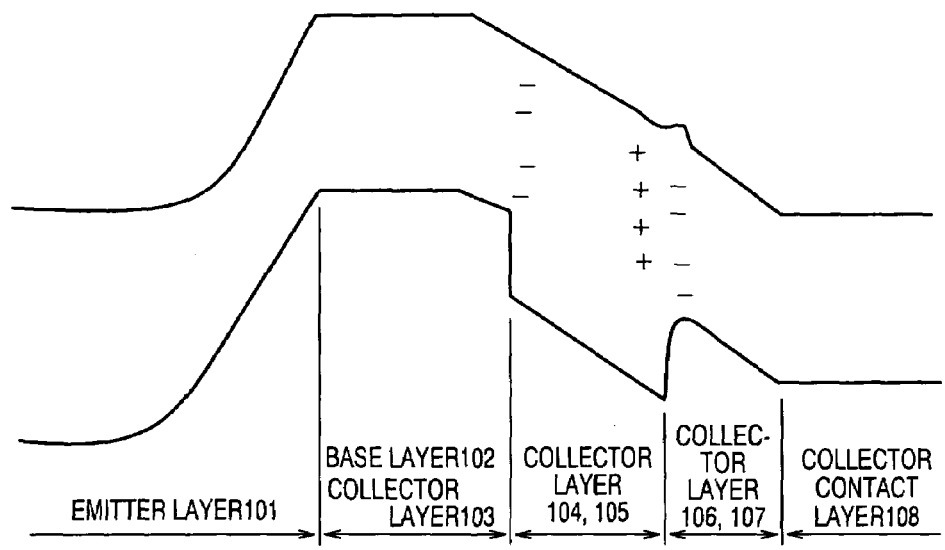
FIG. 2 is a band diagram in the first embodiment.

By contrast, in this embodiment, as is also shown in a band diagram of FIG. 2, the p-type GaAs collector layer 106 compensates for the influence of interface electric charge in the interface between the n-type InGaP collector layer and n-type GaAs collector layer. This improves the distortion characteristics of the amplifier by reducing the capacitance when a forward bias is applied in the collector-to-base path, and increases the efficiency of the amplifier by decreasing a collector-to-emitter offset voltage Vce offset.

(2) Second Embodiment

A semiconductor device according to the second embodiment of the present invention will be described below.

Figure 3:
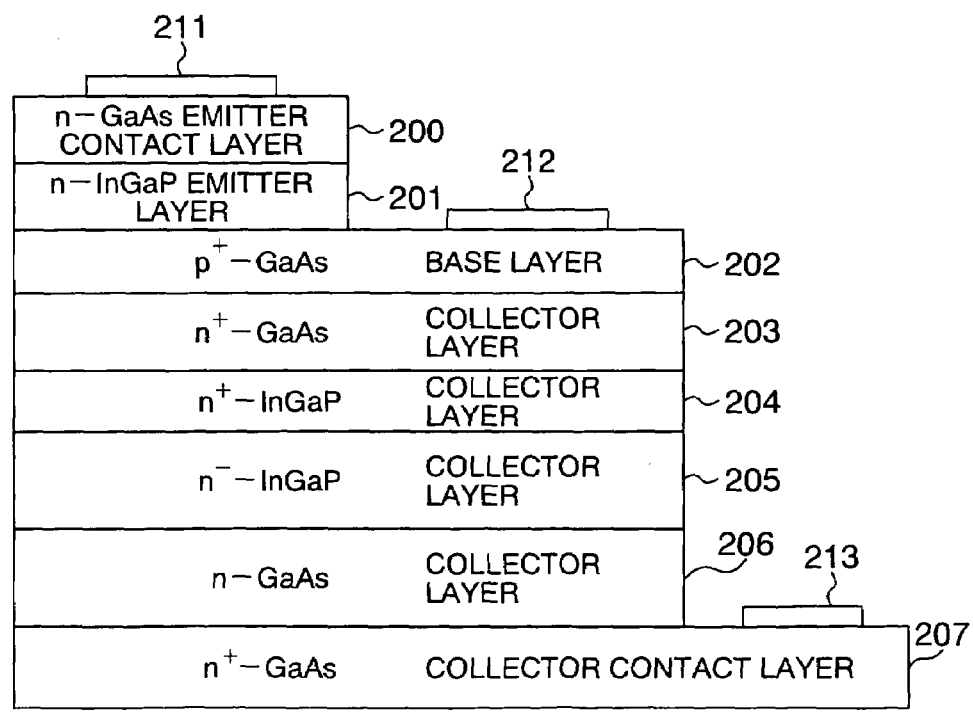
FIG. 3 is a longitudinal sectional view showing the arrangement of a semiconductor device according to the second embodiment of the present invention.

As shown in FIG. 3, an n-type electrode 213 is formed on the surface of a portion of an n⁺-type GaAs collector contact layer 207. On the rest of the surface, an n-type GaAs collector layer 206, n⁻-type InGaP collector layer 205, n⁺-type InGaP collector layer 204, n⁺-type GaAs collector layer 203, and p⁺-type GaAs base layer 202 are formed. A p-type electrode 212 is formed on the surface of a portion of the p⁺-type GaAs base layer 202. An n-type InGaP emitter layer 201 is formed on the rest of the surface, an n-type GaAs emitter contact layer 200 is formed on the n-type InGaP emitter layer 201, and an n-type electrode 211 is formed on the surface of the n-type GaAs emitter contact layer 200.

The ordered n-type InGaP layer 201 or the partially ordered n-type InGaP layer 201 is formed as a wide-gap emitter layer, the heavily doped p⁺-type GaAs layer 202 is formed as a base layer, and the heavily doped n⁺-type GaAs layer 203 is formed as a collector layer in contact with the base layer. In addition, the disordered heavily doped n-type InGaP layer 204, the disordered lightly doped n-type InGaP layer 205, the lightly doped n-type GaAs layer 206, and the heavily doped n-type GaAs layer 207 serving as a collector contact layer are formed.

A double heterojunction bipolar transistor is formed using a wafer material having this stacked structure, and a power amplifier is manufactured by using this double heterojunction bipolar transistor.

Figure 4:
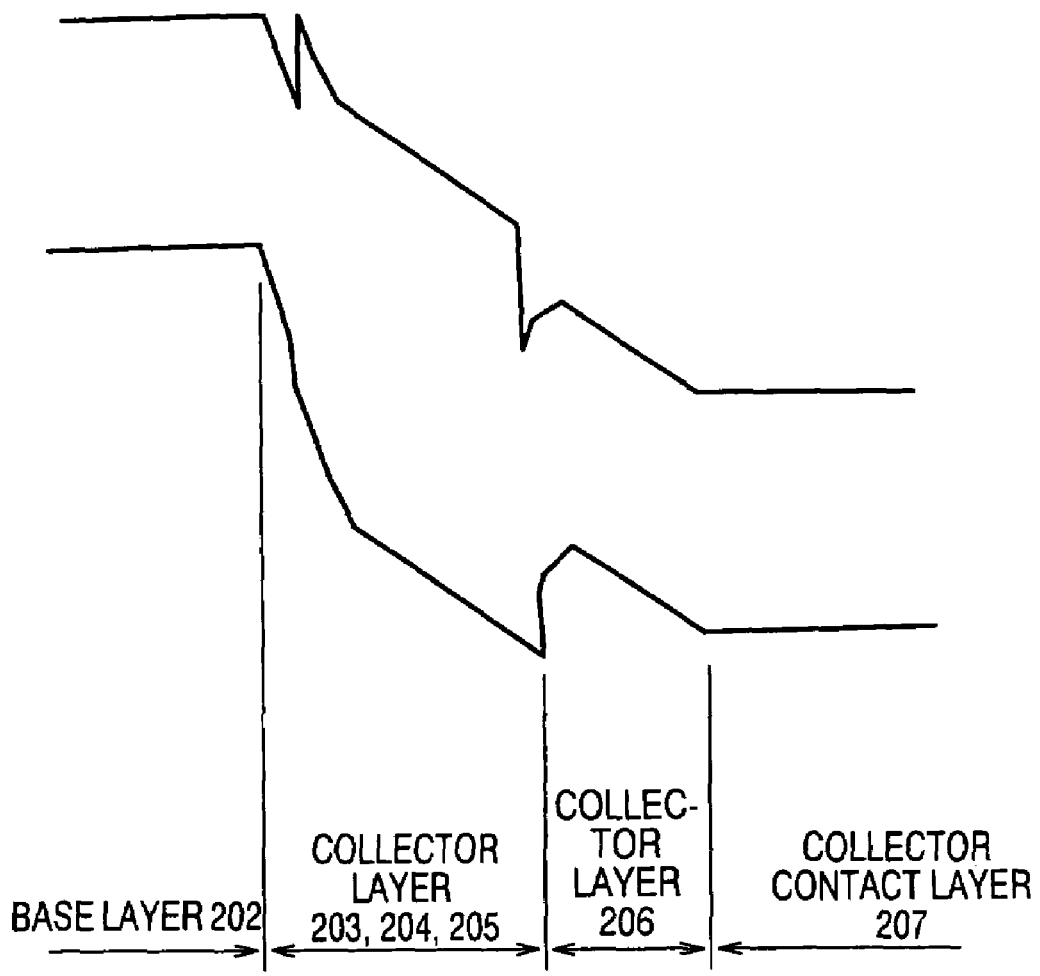
FIG. 4 is a band diagram in the second embodiment.

FIG. 4 is a band diagram of this embodiment. In this embodiment, the disordered lightly doped n-type InGaP layer 205 is formed as a collector layer. This suppresses interface electric charge generated in the interface between the ordered InGaP layer and the GaAs layer, and improves the distortion characteristics of the amplifier.

Also, the heavily doped n-type InGaP layer 204 and heavily doped n-type GaAs layer 203 are inserted between the disordered n-type InGaP layer 205 and the base layer 202. This suppresses the effect of blocking electrons from the base layer 202 to the collector layer 205. Consequently, an offset voltage Vce offset decreases, and the efficiency increases.

(3) Third Embodiment

Figure 5:
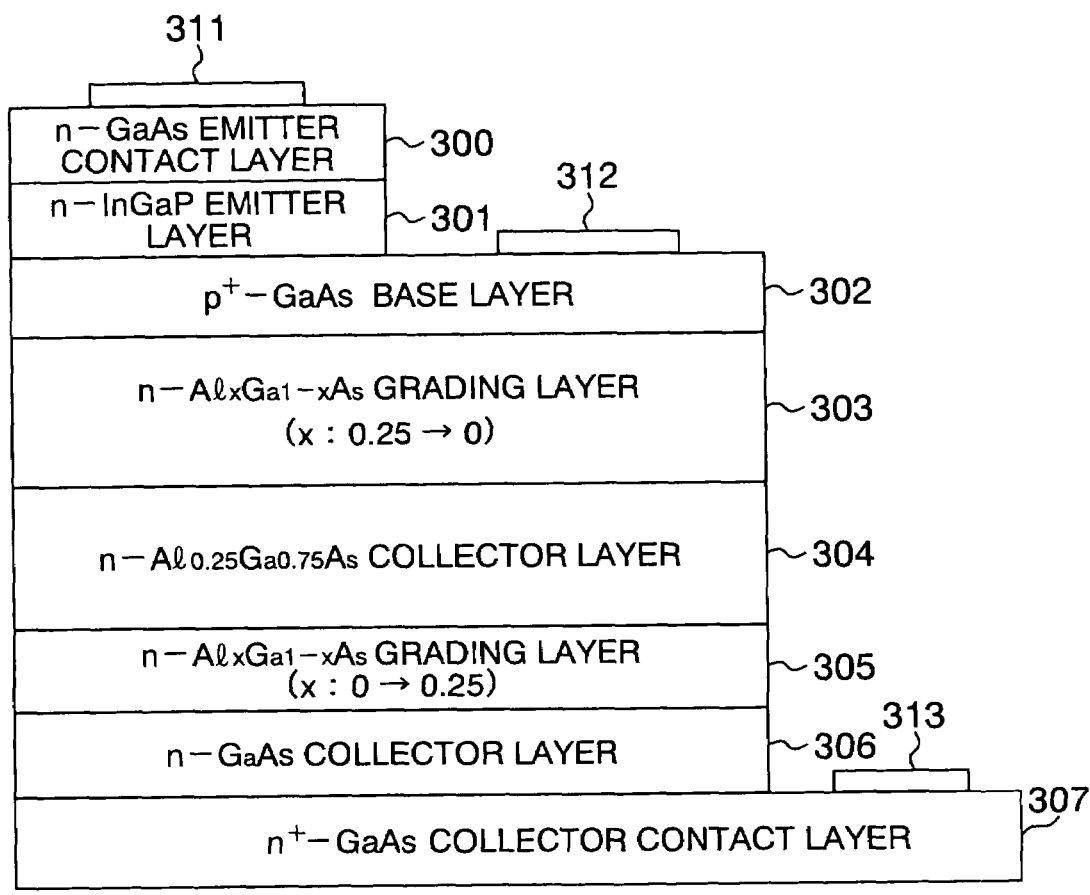
FIG. 5 is a longitudinal sectional view showing the arrangement of a semiconductor device according to the third embodiment of the present invention.

A semiconductor device according to the third embodiment of the present invention will be described below with reference to FIG. 5.

An n-type electrode 313 is formed on the surface of a portion of an n⁺-type GaAs collector contact layer 307. On the rest of the surface, an n-type GaAs collector layer 306, n-type $A_xGa_{(1-x)}As$ (x; 0→0.25) grading layer 305, n-type $Al_{0.25}Ga_{0.75}As$ collector layer 304, n-type $Al_xGa_{(1-x)}As$ (x; 0.25→0) grading layer 303, and p⁺-type GaAs base layer 302 are formed. A p-type electrode 312 is formed on the surface of a portion of the p⁺-type GaAs base layer 302, and an n-type InGaP emitter layer 301 is formed on the rest of the surface. An n-type GaAs emitter contact layer 300 is formed on the n-type InGaP emitter layer 301, and an n-type electrode 311 is formed on the surface of the n-type GaAs emitter contact layer 300.

In this manner, the n-type InGaP layer 301 is formed as a wide-gap emitter layer, the 4e19-cm$^{-3}$ p-type GaAs layer 302 is formed as a base layer, and the 50-nm thick, 5e16- cm$^{-3}$ n-type Al$_x$Ga$_{(1-x)}$As (x; 0.25→0) grading layer 303 is formed as a collector layer in contact with the base layer.

In addition, the 50-nm thick, 5e16-cm$^{-3}$ n-type Al$_{0.25}$Ga$_{0.75}$As layer 304, 50-nm thick, 5e16-cm$^{-3}$ n-type Al$_x$Ga$_{(1-x)}$As (x; 0→0.25) layer 305, and 1e16-cm$^{-3}$ n-type GaAs layer 306 are formed as collector layers, and the 5e18-cm$^{-3}$ heavily doped n-type GaAs layer 307 is formed as a collector contact layer.

Figure 6:
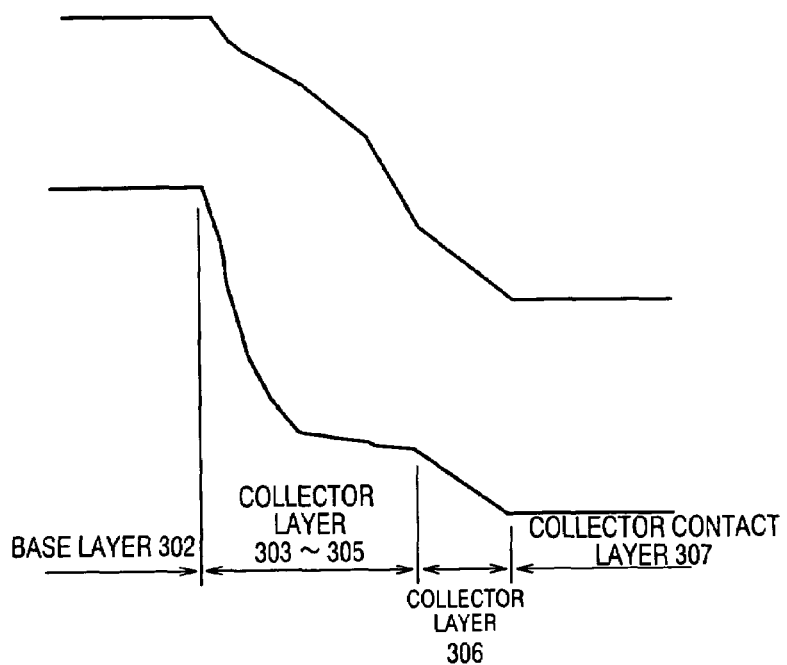
FIG. 6 is a band diagram when a collector current flows during a normal operation in the third embodiment.
Figure 7:
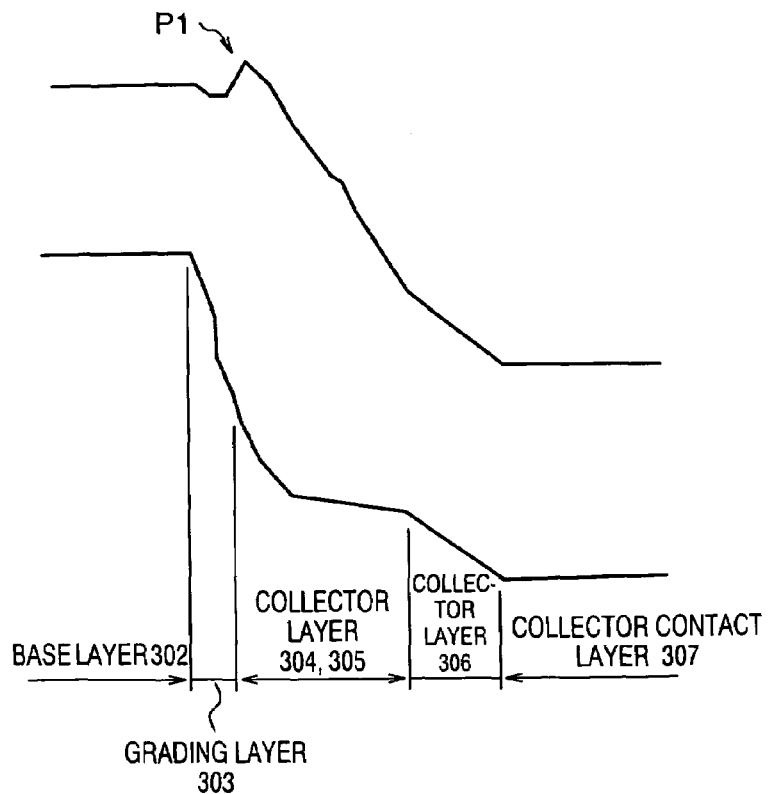
FIG. 7 is a band diagram when a collector current higher than that in a normal operation flows in the third embodiment.

FIG. 6 shows a band diagram when a normal operating electric current flows in this embodiment having the above structure. FIG. 7 shows a band diagram when an operating electric current higher than the normal operating electric current flows. Referring to FIG. 7, the presence of the n-type Al$_x$Ga$_{(1-x)}$As (x; 0.25→0) grading layer 303 forms a barrier at a point P1 when a high collector current flows, and this suppresses an increase in collector current.

A double heterojunction bipolar transistor is formed using a wafer material having this stacked structure, and a power amplifier is manufactured by using this double heterojunction bipolar transistor.

As described previously, when an InGaP layer is used as a collector layer, interface electric charge is generated between this InGaP layer and a GaAs layer. In this embodiment, however, the influence of this interface electric charge can be suppressed by using the AlGaAs layers 303 to 305 as collector layers. This reduces the capacitance when a forward bias is applied in the collector-to-base path, and improves the distortion characteristics of the amplifier. Consequently, an offset voltage Vce offset decreases, and the efficiency increases.

Also, if a collector current higher than that of a normal operation flows, the barrier against electrons injected from the base layer 302 into the collector layer can be increased by adjusting the thickness of the AlGaAs grading layer 303 in contact with the base layer 302, thereby preventing thermal run away.

More specifically, by adjusting the thickness of the AlGaAs grading layer 303, a collector current which flows when the barrier for blocking electrons flowing from the base layer 302 to the collector layer functions can be controlled to a desired value. Accordingly, it is possible to set such that the barrier functions when a collector current higher than that of a normal operation flows.

Furthermore, by adjusting the impurity concentrations in the AlGaAs layers 303 to 305, a collector current value which decreases the current amplification factor by base push out when a high collector current flows can be controlled to a desired value. This prevents destruction of the device by thermal run away.

(4) Fourth Embodiment

Figure 8:
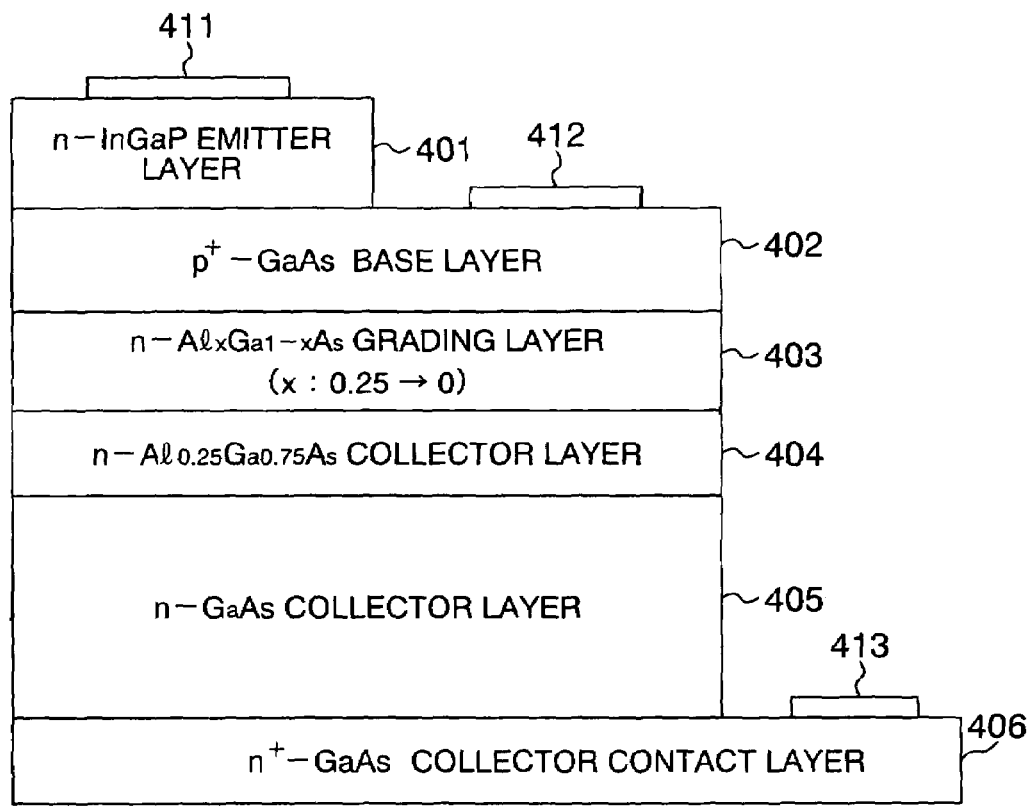
FIG. 8 is a longitudinal sectional view showing the arrangement of a semiconductor device according to the fourth embodiment of the present invention.

The fourth embodiment of the present invention will be described below with reference to FIG. 8.

An n-type electrode 413 is formed on the surface of a portion of an n$^+$-type GaAs collector contact layer 406. On the rest of the surface, an n-type GaAs collector layer 405, n-type Al$_{0.25}$Ga$_{0.75}$As layer 404, n-type Al$_x$Ga$_{(1-x)}$As (x; 0.25→0) grading layer 403, and p$^+$-type GaAs base layer 402 are formed. A p-type electrode 412 is formed on the surface of a portion of the p$^+$-type GaAs base layer 402, and an n-type InGaP emitter layer 401 is formed on the rest of the surface. An n-type electrode 411 is formed on the surface of the n-type InGaP emitter layer 401.

In this way, the n-type InGaP layer 401 is formed as a wide-gap emitter layer, the 4e19-cm$^{-3}$ p-type GaAs layer 402 is formed as a base layer, and the 5e16-cm$^{-3}$ n-type Al$_x$Ga$_{(1-x)}$As (x; 0→0.25) grading layer 403, 5e16-cm$^{-3}$ n-type Al$_{0.25}$Ga$_{0.75}$As layer 404, and 1e16-cm$^{-3}$ n-type GaAs layer 405 are formed as collector layers in contact with the base layer. In addition, the 5e18-cm$^{-3}$ heavily doped n-type GaAs layer 406 is formed as a collector contact layer.

Figure 9:
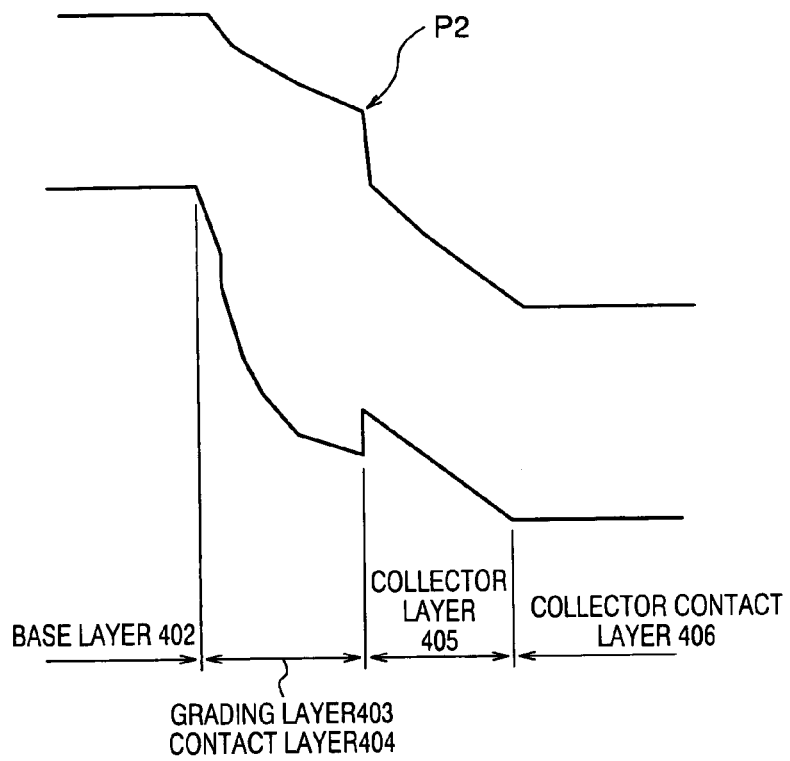
FIG. 9 is a band diagram in the fourth embodiment.

FIG. 9 shows a band diagram of this embodiment. As indicated by a point P2 in FIG. 9, a barrier is formed by an abrupt junction between the n-type Al$_{0.25}$Ga$_{0.75}$As layer 404 and n-type GaAs layer 405. This barrier does not function when a collector current flows from the base layer 402 to the collector layers 403 to 405. However, the barrier functions against electrons flowing in the opposite direction, i.e., flowing from the collector layers 405 and 406 to the base layer 402.

A double heterojunction bipolar transistor is formed using a wafer material having this stacked structure, and a power amplifier is manufactured by using this double heterojunction bipolar transistor.

Figure 10:
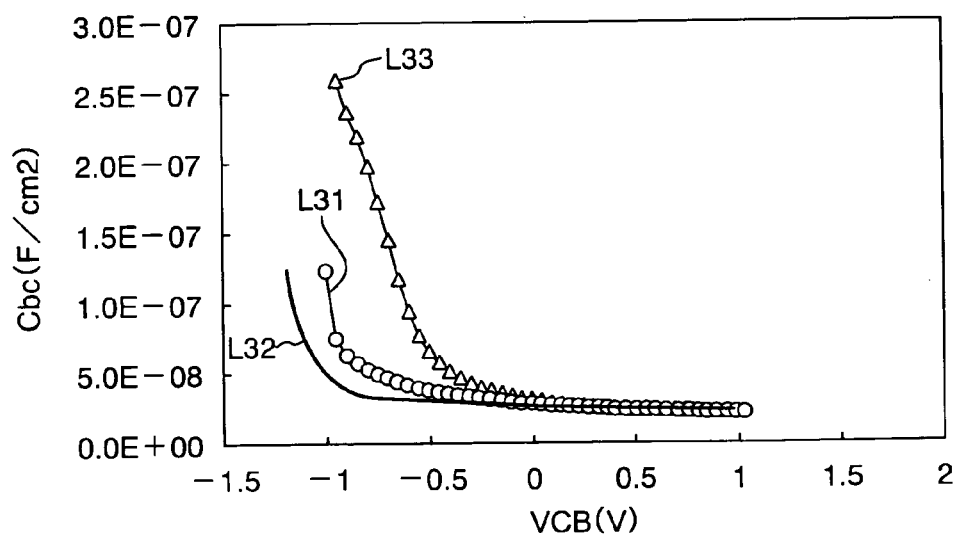
FIG. 10 is a graph showing the dependence of a base-to-collector capacitance Cbc on a collector-to-base voltage VCB in each of the first to fourth embodiments and the conventional semiconductor device.

This realizes the dependence of a base-to-collector capacitance Cbc on a collector-to-base voltage VCB as shown in FIG. 10. Referring to FIG. 10, a curve L31 indicates the first to third embodiments described above, a curve L32 indicates the fourth embodiment, and a curve L33 indicates the conventional semiconductor device shown in FIG. 13. Comparing the curves L31 and L32 with the curve L33 reveals that the increase in base-to-collector capacitance Cbc is suppressed in the embodiments of the present invention.

In addition to the effects obtained by the third embodiment described above, this embodiment makes it possible to suppress the increase in capacitance when a forward bias is applied in the collector-to-base path, by lowering the barrier against electrons injected from the base layer 402 into the collector layers 403 to 405, and raising the barrier only when electrons are injected from the collector layers 405 and 406 into the base 402.

Consequently, an offset voltage Vce offset lowers, and the efficiency increases, so a power amplifier having good characteristics can be manufactured.

(5) Fifth Embodiment

Figure 11:
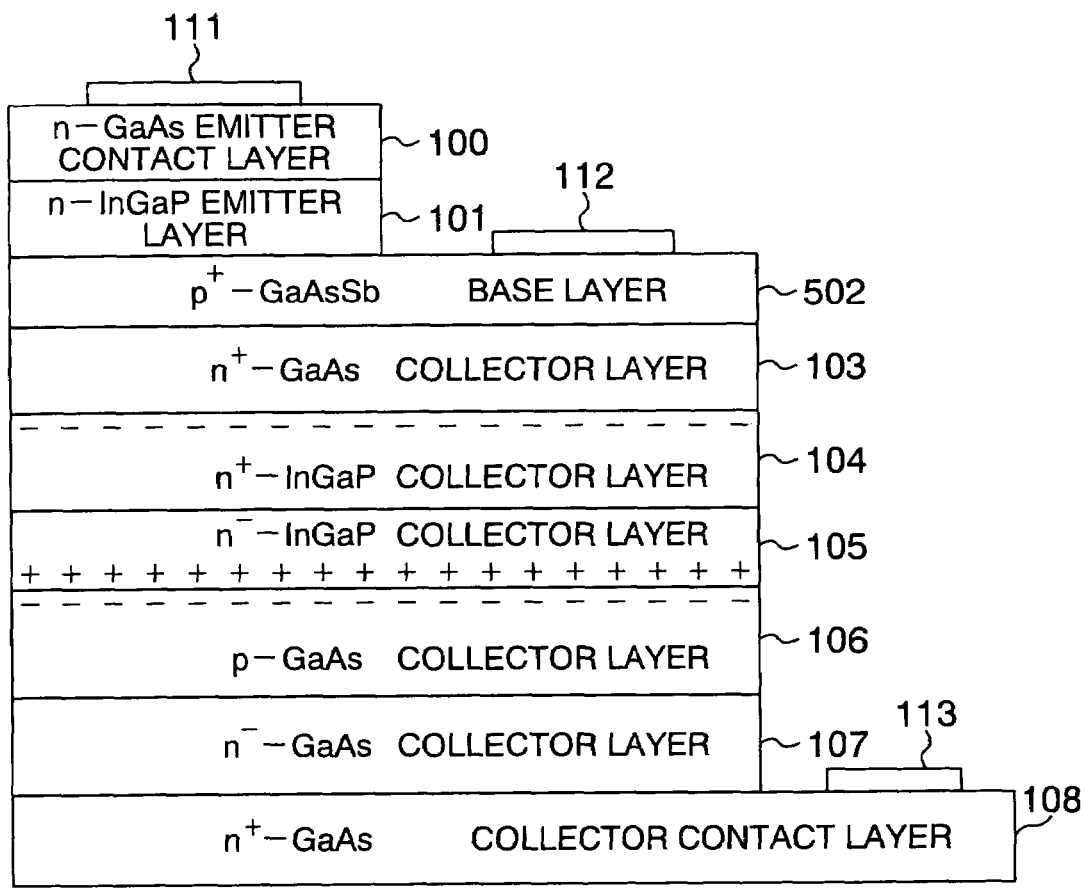
FIG. 11 is a longitudinal sectional view showing the arrangement of a semiconductor device according to the fifth embodiment of the present invention.

The fifth embodiment of the present invention will be described below with reference to FIG. 11.

In this embodiment, the 50-nm thick, p$^+$-type GaAs base layer 102 having a doping concentration of $4\times10^{19}$ cm$^{-3}$ in the first embodiment is replaced with a 40-nm thick, p$^+$-type GaAs$_{0.9}$Sb$_{0.1}$ base layer 502 having a doping concentration of $1\times10^{20}$ cm$^{-3}$.

The band gap of the GaAs$_{0.9}$Sb$_{0.1}$ base layer 502 is smaller than that of the GaAs base layer 102. Therefore, not only the ON voltage decreases, but also the band discontinuity in the valence band in the base-collector junction further increases. This suppresses injection of holes from the base layer into the collector layer. Accordingly, an offset voltage Vce offset decreases more than when the base layer is formed by GaAs. As a consequence, a power amplifier having a low ON voltage, high efficiency, and high linearity can be realized.

Note that the GaAs$_{0.9}$Sb$_{0.1}$ base layer 502 may also have a so-called grading structure in which the composition ratio of Sb increases from 0 to 0.1 from the emitter side to the collector side. Note also that the base layer may also be formed by using GaInAsN instead of GaAsSb.

Furthermore, although collectors layers 104 and 105 are formed by using InGaP, another material which generates interface electric charge by ordering may also be used.

(6) Sixth Embodiment

Figure 12:
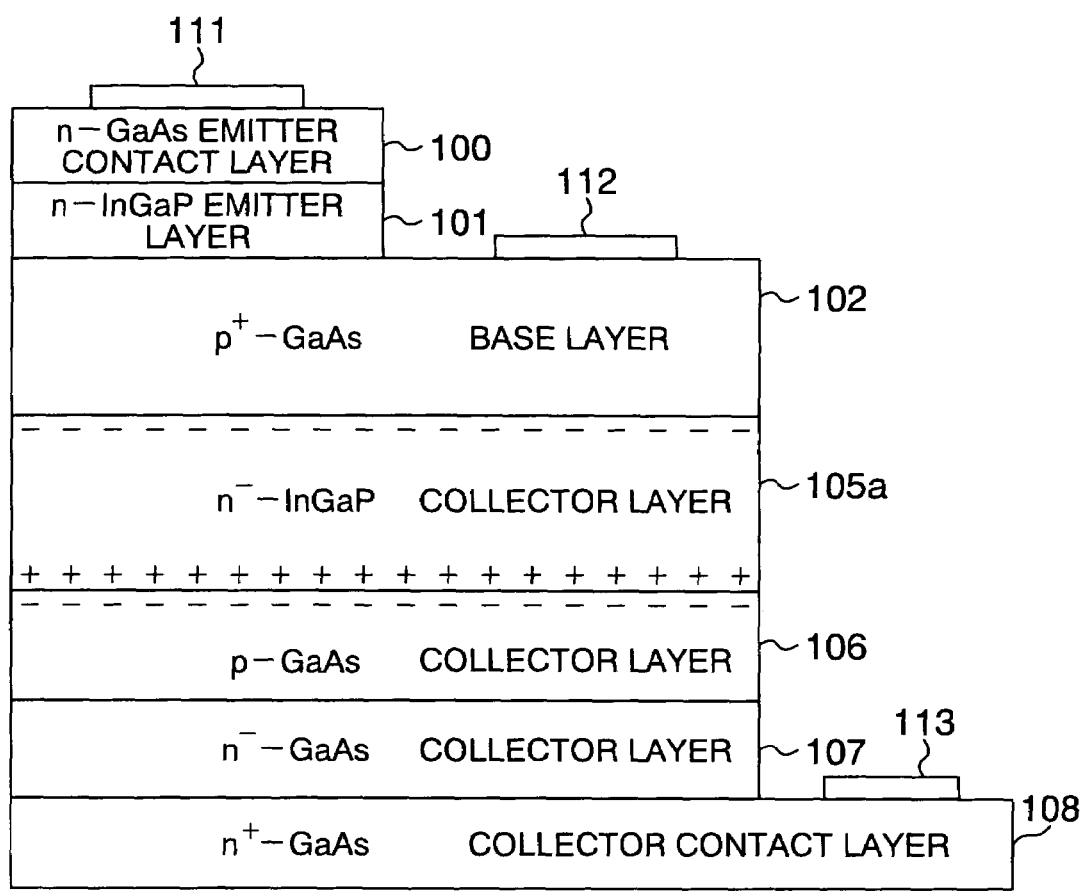
FIG. 12 is a longitudinal sectional view showing the arrangement of a semiconductor device according to the sixth embodiment of the present invention.

A semiconductor device according to the sixth embodiment of the present invention will be described below with reference to FIG. 12.

In this embodiment, the n$^+$-type InGaP collector layer 104 and n$^+$-type GaAs collector layer 103 in the first embodiment are omitted, and a 20-nm thick, n$^-$-type InGaP collector layer 105a having a doping concentration of $1 \times 10^{16}$ cm$^{-3}$ is formed. Other constituent elements are the same as in the first embodiment, so an explanation thereof will be omitted.

As described in the first embodiment, the band gap of InGaP layers used in the formation of an emitter layer 101 and collector layer 105 is larger than that of a GaAs layer used in the formation of a base layer 102.

A collector layer has a stacked structure including the collector layer 105 formed by an n-type GaAs layer having a band gap larger than that of the GaAs base layer 102, a p-type collector layer 106 in contact with the collector layer 105, and an n-type GaAs collector layer 107 in contact with the collector layer 106 and formed by a GaAs layer having a band gap smaller than that of the collector layer 105.

The thickness of the p-type GaAs collector layer 106 is desirably not more than 20 nm so as not to interfere with the transition of electrons. In this embodiment, the thickness is 5 nm.

A double heterojunction bipolar transistor is formed using a wafer material having this stacked structure, and a power amplifier is manufactured by using this double heterojunction bipolar transistor.

Since the 5-nm thick, p-type GaAs collector layer 106 having a doping concentration of $5 \times 10^{18}$ cm$^{-3}$ is formed, it is possible to cancel a positive interface electric charge of about $1 \times 10^{12}$ cm$^{-2}$ formed in the interface between the p-type GaAs collector layer 106 and the 20-nm thick, n$^-$-type InGaP collector layer 105 formed on the surface of the p-type GaAs collector layer 106 and having a doping concentration of $5 \times 10^{16}$ cm$^{-3}$.

In addition, since the p-type GaAs collector layer 106 has a doping concentration of $5 \times 10^{18}$ cm$^{-3}$ and a thickness of 5 nm, it is possible to set the sheet carrier concentration between $1 \times 10^{11}$ to $1 \times 10^{13}$ cm$^{-2}$, and cancel the interface electric charge without interfering with the transition of electrons in the collector layer.

The semiconductor device according to each of the above embodiments can suppress the influence of interface electric charge in the collector layer, and increase the efficiency by lowering the offset voltage Vce offset. It is also possible to improve the distortion characteristics by eliminating the barrier which blocks the flow of electrons from the base layer to the collector layer.

Each of the above embodiments is merely an example and hence does not limit the present invention. Therefore, these embodiments can be variously modified within the technical scope of the present invention.

What is claimed is:

1. A semiconductor device comprising:
a collector contact layer made of an n-type GaAs layer;
a first collector layer formed on said collector contact layer and made of an n-type GaAs layer;
a second collector layer formed on said first collector layer and made of a p-type GaAs layer;
a third collector layer formed on said second collector layer and made of an n-type InGaP layer;
a fourth collector layer formed on said third collector layer and made of an n-type InGaP layer having an impurity concentration higher than that of said third collector layer;
a fifth collector layer formed on said fourth collector layer and made of an n-type GaAs layer;
a base layer formed on said fifth collector layer and made of a p-type GaAs layer; and
an emitter layer formed on said base layer and made of an n-type InGaP layer.

2. A semiconductor device comprising:
a collector contact layer made of an n-type GaAs layer;
a first collector layer formed on said collector contact layer and made of an n-type GaAs layer;
a second collector layer formed on said first collector layer and made of an n-type InGaP layer;
a third collector layer formed on said second collector layer and made of an n-type InGaP layer having an impurity concentration higher than that of said second collector layer;
a fourth collector layer formed on said third collector layer and made of an n-type GaAs layer;
a base layer formed on said fourth collector layer and made of a p-type GaAs layer; and
an emitter layer formed on said base layer and made of an n-type InGaP layer.

3. A semiconductor device comprising:
a collector contact layer made of an n-type GaAs layer;
a first collector layer formed on said collector contact layer and made of an n-type GaAs layer;
a second collector layer formed on said first collector layer and made of an n-type Al$_x$Ga$_{(1-x)}$As (x; 0→y) grading layer;
a third collector layer formed on said second collector layer and made of an n-type Al$_y$Ga$_{(1-y)}$As layer;
a fourth collector layer formed on said third collector layer and made of an n-type Al$_z$Ga$_{(1-z)}$As (z; y→0) grading layer;
a base layer formed on said fourth collector layer and made of a p-type GaAs layer; and
an emitter layer formed on said base layer and made of an n-type InGaP layer.

4. A semiconductor device comprising:
a collector contact layer made of an n-type GaAs layer;
a first collector layer formed on said collector contact layer and made of an n-type GaAs layer;
a second collector layer formed on said first collector layer and made of an n-type Al$_y$Ga$_{(1-y)}$As layer;
a third collector layer formed on said second collector layer and made of an n-type Al$_x$Ga$_{(1-x)}$As (x; y→0) grading layer;
a base layer formed on said third collector layer and made of a p-type GaAs layer; and
an emitter layer formed on said base layer and made of an n-type InGaP layer.

5. A semiconductor device comprising a collector layer, a base layer formed on said collector layer, and an emitter layer formed on said base layer,
wherein a material used in said emitter layer has a band gap larger than that of a material used in said base layer, and
said collector layer comprises:
a first n-type semiconductor layer formed by a material having a band gap larger than that of the material used in said base layer;

a p-type semiconductor layer formed in contact with said first n-type semiconductor layer; and a second n-type semiconductor layer formed in contact with said p-type semiconductor layer by using a material having a band gap smaller than that of said first n-type semiconductor layer, wherein said first n-type semiconductor layer is made of an n-type InGaP layer.

6. A device according to claim 5, wherein an impurity concentration of said p-type semiconductor layer has a value which cancels interface electric charge generated in a junction interface between said first n-type semiconductor layer made of an n-type InGaP layer and said p-type semiconductor layer.

7. A device according to claim 5, wherein said p-type semiconductor layer is made of a p-type GaAs layer.

8. A device according to claim 5, wherein said p-type semiconductor layer is not more than 20 nm.

9. A device according to claim 5, wherein a sheet carrier concentration formed by said p-type semiconductor layer is $1 \times 10^{11}$ to $1 \times 10^{13}$ cm$^{-2}$.

10. A device according to claim 5, wherein said base layer is made of a GaAsSb layer.

* * * * *